United States Patent
Bruhnke et al.

(10) Patent No.: US 6,762,635 B2
(45) Date of Patent: Jul. 13, 2004

(54) CLOCK GENERATOR, PARTICULARLY FOR USB DEVICES

(75) Inventors: Michael Bruhnke, München (DE); Viktor Preis, Taufkirchen (DE); Uwe Weder, Au/Hallertau (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/373,891

(22) Filed: Feb. 25, 2003

(65) Prior Publication Data

US 2003/0174795 A1 Sep. 18, 2003

Related U.S. Application Data

(63) Continuation of application No. PCT/DE01/03187, filed on Aug. 21, 2001.

(30) Foreign Application Priority Data

Aug. 25, 2000  (DE) .......................................... 100 41 772

(51) Int. Cl.[7] .............................................. H03L 7/00
(52) U.S. Cl. ...................................... 327/160; 327/291
(58) Field of Search ............................... 327/141, 151, 327/155–156, 159–160, 291–292, 299; 375/354, 362, 364, 376

(56) References Cited

U.S. PATENT DOCUMENTS 4,849,703 A * 7/1989 Easley et al. ............... 327/160
5,280,195 A   1/1994 Goto et al. .................. 327/294
6,583,654 B2 * 6/2003 Kim et al. ................... 327/160

FOREIGN PATENT DOCUMENTS

DE        42 05 346 C2    8/1992

OTHER PUBLICATIONS

Tietze et al.: "Halbleiter–Schaltungstechnik" [Semiconductor Circuit Technology], Springer Verlag, 11th Edition, 1999, pp. 190 et seq.

* cited by examiner

Primary Examiner—My-Trang Nu Ton
(74) Attorney, Agent, or Firm—Laurence A. Greenberg; Werner H. Stemer; Ralph E. Locher

(57) ABSTRACT

In accordance with the USB specifications, an accuracy of 0.25% is required for the data transmission rate. To generate a clock signal that allows this accuracy, the invention uses a clock generator unit that does not require a crystal. The clock generator unit includes an internal clock generator, a pulse counter that is connected to the internal clock generator, a pulse number memory, and a pulse filter. The pulse counter counts the number of internally generated clock pulses between two pulses of the synchronization signal, which are transmitted in accordance with the USB specification. The difference between the ascertained pulse number and a nominal pulse number is evaluated and is used for controlling the pulse-suppressing pulse filter. This results in a stabilized clock signal.

21 Claims, 2 Drawing Sheets

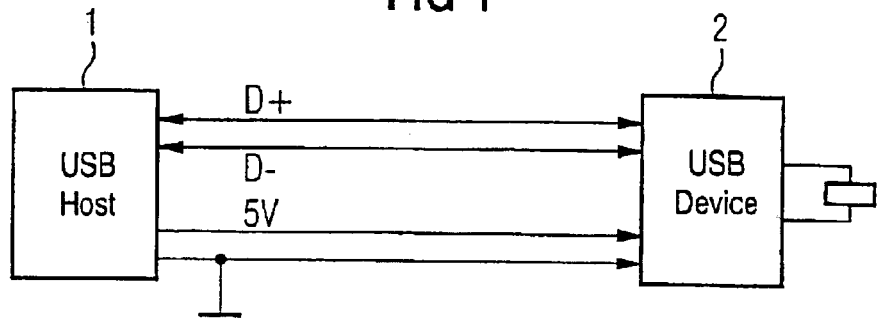
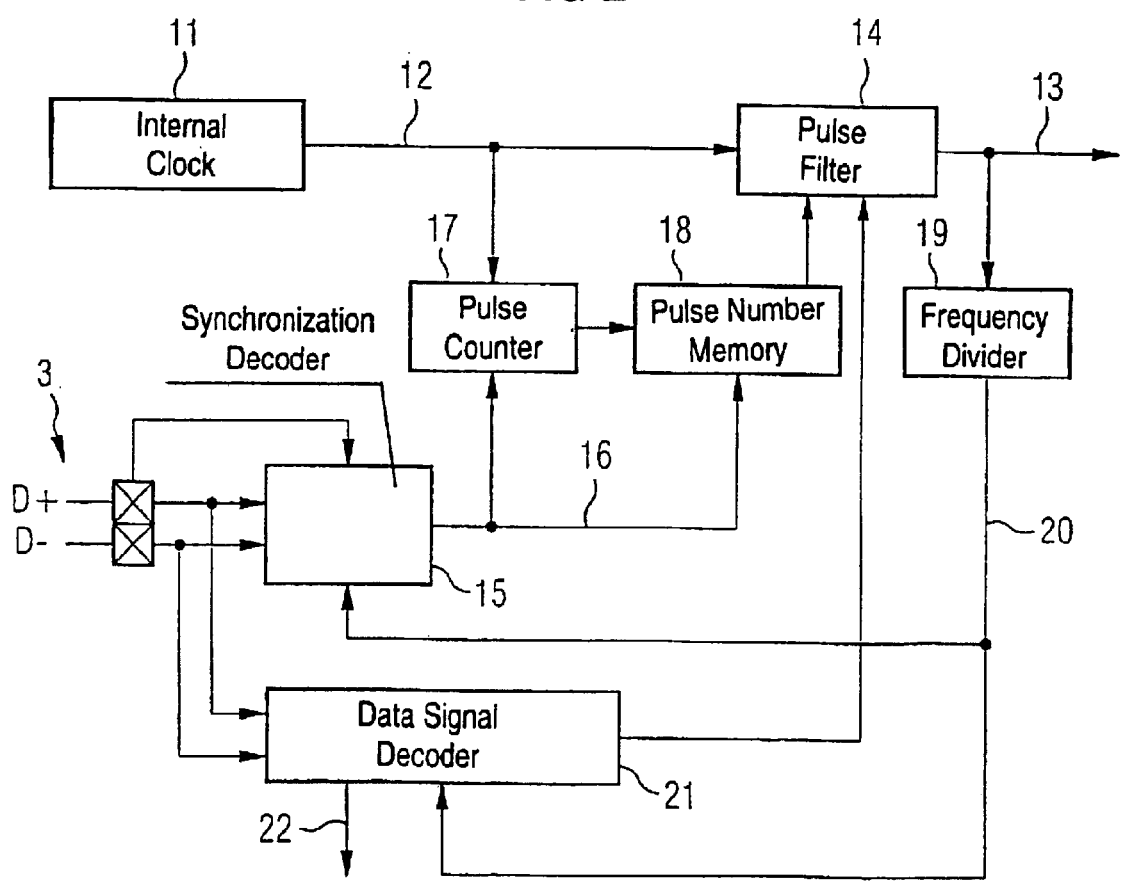

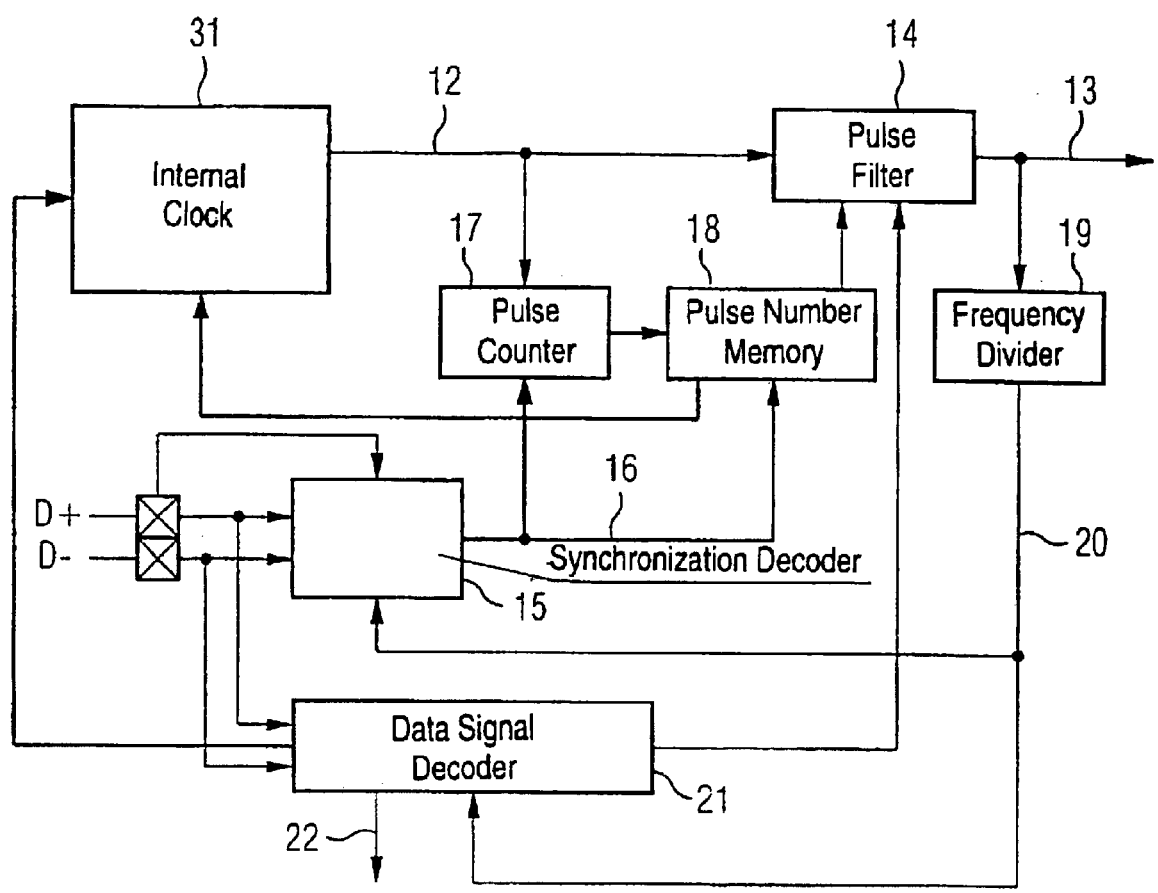

US 6,762,635 B2

CLOCK GENERATOR, PARTICULARLY FOR USB DEVICES

CROSS-REFERENCE TO RELATED APPLICATION

This application is a continuation of copending International Application No. PCT/DE01/03187, filed Aug. 21, 2001, which designated the United States and was not published in English.

BACKGROUND OF THE INVENTION

Field of the Invention

The invention relates to a clock generator unit that is used particularly in connection with USB devices. In accordance with the USB specification, a particular accuracy needs to be observed for the data transmission rates. In full speed mode, an accuracy of ±0.25% is required. This accuracy can be achieved only through the clock accuracy; the clock used, therefore, also needs to have this high level of accuracy. However, the USB bus contains no explicit clock line. Each device, therefore, needs to be able to generate the clock itself. If the accuracy for the clock signal is not achieved, then the device is not USB compatible.

Clock signals are normally generated using a circuit on a chip, with an accuracy of ±3% being able to be achieved. To increase the accuracy, it is a known practice to use an additional crystal. Such crystal oscillator circuits are known, by way of example, from "Tietze, Schenk: Halbleiter-Schaltungstechnik [Semiconductor circuitry], Springer Verlag 1999, 11th edition, pages 910 ff.". In such a case, the crystal module is in the form of an external component. For many applications, however, it is necessary or desirable for all the modules to be on one chip. When using an external crystal, one or two additional pins are required on the chip, which is generally undesirable and generates additional cost. Another problem is the size of a crystal because in chip cards, for example, a thickness of 800 μm is not meant to or cannot be exceeded. With a crystal, these specifications cannot be observed.

SUMMARY OF THE INVENTION

It is accordingly an object of the invention to provide a clock generator, particularly for USB devices, that overcomes the hereinafore-mentioned disadvantages of the heretofore-known devices of this general type and that generates clock signals with a particularly high level of accuracy but, nevertheless, does not require a crystal module.

With the foregoing and other objects in view, there is provided, in accordance with the invention, a clock generator unit for receiving a synchronization signal, including an internal clock generator generating clock pulses as a generated clock signal at an internal clock frequency greater than or equal to a nominal clock frequency of a desired stabilized clock signal, a pulse counter connected to the internal clock generator, the pulse counter to be set to a start value by the synchronization signal, a pulse number memory storing, as an actual value, a number of clock pulses generated between preceding pulses of the synchronization signal, and a pulse filter applying the number of clock pulses stored in the pulse number memory and a given nominal number of clock pulses to ascertain a number of pulses needing to be filtered out of the generated clock signal and filtering the generated clock signal to allow a number of clock pulses corresponding to the nominal clock frequency to be tapped off as the stabilized clock signal.

According to the invention, a clock generator unit has:

an internal clock generator that generates clock pulses at an internal clock frequency that is higher than or equal to the nominal clock frequency of a stabilized clock signal;

a pulse counter that is connected to the internal clock generator and can be set to a start value by a synchronization signal;

a pulse number memory that can store, as an actual value, the number of clock pulses generated between preceding pulses of the synchronization signal; and a pulse filter that uses the number stored in the pulse number memory and a stipulated nominal number of clock pulses to ascertain the number of pulses that need to be filtered out of the generated clock signal, and that filters the generated clock signal such that a number of clock pulses that corresponds to the nominal number can be tapped off as a stabilized clock signal.

The way in which the inventive clock generator unit works is based on a synchronization pulse being transmitted, in accordance with the USB specifications, at regular intervals, for example, every millisecond in full speed mode, with the frequency of the synchronization signal having a much higher level of accuracy than the required data transmission rate. The fixed interval between the pulses of the synchronization signal and the desired nominal frequency are taken as a basis for stipulating how many clock pulses the clock generator needs to generate between two pulses of the synchronization signal. By comparing the nominal number of pulses with the actual number of pulses between two preceding synchronization pulses, it is known how much the actual clock frequency differs from the nominal clock frequency. By filtering out excess pulses from the internally generated clock signal, the actual clock frequency can be reduced to the necessary nominal clock frequency.

In accordance with another feature of the invention, the pulse number memory stores a number of clock pulses generated between two preceding pulses of the synchronization signal.

In accordance with a further feature of the invention, the pulse number memory stores an average number of clock pulses generated between a plurality of preceding pulses of the synchronization signal.

Not only is the number of pulses between two preceding synchronization signals evaluated, but, also, an average is formed between a plurality of periods. This allows the frequency's range of fluctuation to be reduced further.

One advantage is that the inventive clock generator device is independent of parameters such as technology, temperature, or power consumption. It is, therefore, possible to dispense with expensive measures for observing manufacturing tolerances.

In accordance with the USB specifications, the accuracy of the synchronization signals is higher by a factor of more than five than the accuracy of the stabilized clock frequency required. As a result, a sufficiently large scope for change is left for tuning the components.

In accordance with an added feature of the invention, there is provided a synchronization decoder receiving an input signal, the synchronization decoder being connected to the stabilized clock signal and ascertaining the synchronization signal from the input signal.

In accordance with an additional feature of the invention, the synchronization signal is a synchronization signal provided in accordance with USB specifications.

For the accuracy, it is also advantageous if the stabilized clock signal is an internal stabilized clock signal whose frequency is higher, in an even-numbered ratio, than the nominal clock frequency of an operating clock signal. In such a case, a frequency divider is provided that generates the operating clock signal at the prescribed nominal clock frequency from the internal stabilized clock signal.

A further advantage arises if the pulse memory's value and/or the output signal from a synchronization decoder and/or the output signal from a signal decoder are fed back to the internal clock generator and this allows the frequency of the internal clock generator to be readjusted.

With the objects of the invention in view, there is also provided a clock generator unit for receiving a synchronization signal, including an internal clock generator generating clock pulses as a generated clock signal at an internal clock frequency greater than or equal to a nominal clock frequency of a desired stabilized clock signal, a pulse counter connected to the internal clock generator, the pulse counter to be set to a start value by the synchronization signal, a pulse number memory connected to the pulse counter, the pulse number memory storing, as an actual value, a number of clock pulses generated between preceding pulses of the synchronization signal, and a pulse filter connected to the internal clock generator and to the pulse number memory, the pulse filter applying the number of clock pulses stored in the pulse number memory and a given nominal number of clock pulses to ascertain a number of pulses needing to be filtered out of the generated clock signal and filtering the generated clock signal to allow a number of clock pulses corresponding to the nominal clock frequency to be tapped off as the stabilized clock signal.

With the objects of the invention in view, there is also provided a clock generator unit for receiving a synchronization signal, including an internal clock generator generating clock pulses as a generated clock signal at an internal clock frequency greater than or equal to a nominal clock frequency of a desired stabilized clock signal, a pulse counter connected to the internal clock generator, the pulse counter to be set to a start value by the synchronization signal, a pulse number memory connected to the pulse counter, the pulse number memory storing, as an actual value, a number of clock pulses generated between preceding pulses of the synchronization signal, and a pulse filter connected to the internal clock generator and to the pulse number memory, the pulse filter ascertaining a number of pulses needing to be filtered out of the generated clock signal based upon the number of clock pulses stored in the pulse number memory and a given nominal number of clock pulses and filtering the generated clock signal to allow a number of clock pulses corresponding to the nominal clock frequency to be tapped off as the stabilized clock signal.

Other features that are considered as characteristic for the invention are set forth in the appended claims.

Although the invention is illustrated and described herein as embodied in a clock generator, particularly for USB devices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a block circuit diagram of a connection between two devices based on the USB standard;

FIG. 2 is a block circuit diagram of a first, simple exemplary embodiment of a clock generator unit according to the invention; and FIG. 3 is a block circuit diagram of a second, extended exemplary embodiment of the clock generator unit of FIG. 2.

DESCRIPTION OF THE PREFERRED EMBODIMENTS

Referring now to the figures of the drawings in detail and first, particularly to FIG. 1 thereof, there is shown a USB connection between two devices, one of them being referred to as the USB host 1 and the other being referred to as the USB device 2. The role of the USB host 1 is taken on by a PC or a HUB, for example. It is, likewise, possible for a HUB or, by way of example, a keyboard, a mouse, a scanner, or a chip card to be used as the USB device 2. Besides a 5-volt connection and a ground connection, two data lines D+ and D− are provided. Through the two data lines D+ and D−, the data traffic runs between the USB host 1 and the USB device 2. Depending on the magnitude of the power requirement for the USB device 2, voltage is supplied by the bus connection or by a separate voltage supply.

In accordance with the USB specifications, a clock line is not provided. It is, therefore, necessary for each USB device to have a separate clock generator that, as stated in the introduction to the description, needs to satisfy high demands on accuracy. To synchronize the data traffic between the USB host 1 and the USB device 2, the USB host 1 sends a synchronization signal at an interval of 1 ms in full speed mode. The synchronization signal has an accuracy of 0.05% in full speed mode.

FIG. 2 now describes a clock generator unit for a USB device 2 that utilizes the incoming, highly accurate synchronization signals to manipulate an internally generated clock signal to achieve the necessary degree of accuracy for the data transmission rate.

An internal clock generator 11 generates an unstabilized clock signal 12 whose frequency is higher than a desired stabilized frequency. To get from the unstabilized clock signal 12 to a stabilized clock signal 13, a pulse filter 14 suppresses individual pulses. To obtain the information regarding how many pulses need to be suppressed, the number of pulses of the unstabilized clock signal 12 that are generated between two pulses of the synchronization signal 16 is counted and is compared with a nominal pulse number.

A synchronization decoder 15 decodes the synchronization signal 16 from an input signal 3 on the data lines D+ and D−. The pulses of the synchronization signal 15 reset a pulse counter 17. This is, subsequently, incremented by the pulses of the unstabilized clock signal 12. At the same time as the pulse counter 17 is reset, the present counter reading is written to a pulse number memory 18. The value in the pulse number memory, thus, describes the number of clock pulses 12 that have been generated between two preceding synchronization pulses 16. The pulse number memory 18 is connected to the pulse filter 14 so that the pulse filter 14 can evaluate the magnitude of the difference between the nominal pulse number and the pulse number generated in the last period. This number of pulses is, then, filtered out of the internal clock signal 12. If the clock frequency of the internal clock generator 11 remains the same during two synchronization signal periods, the frequency at the output of the pulse filter 14, thus, corresponds exactly to the nominal frequency in the second period.

In one beneficial form, the output signal from the pulse filter 14, that is to say, the stabilized clock signal 13, is much higher than the required or operating clock signal 20 and is in an even-numbered ratio therewith. A frequency divider 19, then, obtains the ultimately needed operating clock signal 20; at USB full speed its frequency is 12 MHz. The nominal frequency for the stabilized clock signal would, then, be 48 MHz if the frequency divider 19 were implemented in a ratio of 4:1. The operating clock signal 20 at 12 MHz is, then, supplied to the synchronization decoder 15 and to a data signal decoder 21.

To clarify the invention, the numerical example started above will be taken further. If the frequency of the unstabilized clock signal 12 has an upward discrepancy of 3%, then the frequency generated is 49.44 MHz. During a synchronization signal period of 1 ms, 49,440 clock signals are, thus, generated, while the nominal clock pulse number is 48,000, in line with 48 MHz. Accordingly, 1,440 pulses need to be suppressed, advantageously at the same intervals. In such a case, approximately every 34th pulse would, therefore, be filtered out.

The data signal decoder 21, then, uses the nominal clock frequency of 12 MHz to decode the input signal 3 applied through the lines D+ and D−, and outputs it as a decoded output signal 22 for further processing.

Data are naturally, likewise, sent using the same stabilized clock frequency of 12 MHz.

In the extended exemplary embodiment shown in FIG. 3, an internal clock generator 31 is in a readjustable form. Using the synchronization signal 16 and the value stored in the pulse number memory 18 or using an output signal from the data signal decoder 21, the frequency generated by the internal clock generator 31 is trimmed. This means that the differences between the unstabilized clock signal 12 and the stabilized clock signal 13 are much smaller from the outset.

Another way of improving the control response involves not only evaluating the number of pulses in a preceding synchronization signal period, but, also, forming an average between a plurality of preceding periods. This means that the extreme values arising for the pulse number are much smaller. The pulse number memory 18 can be used to store the average number of clock pulses generated between a plurality of preceding pulses of the synchronization signal 16.

The invention is, naturally, not limited to USB full speed mode, but can also be used in low speed mode. However, the required accuracy in this case is 1.5%, which is much simpler to attain.

In addition, the invention can be applied to other applications, provided that a sufficiently accurate synchronization signal is available.

We claim:

1. A clock generator unit for receiving a synchronization signal, comprising:
   an internal clock generator generating clock pulses as a generated clock signal at an internal clock frequency greater than or equal to a nominal clock frequency of a desired stabilized clock signal;
   a pulse counter connected to said internal clock generator, said pulse counter to be set to a start value by the synchronization signal;
   a pulse number memory storing, as an actual value, a number of clock pulses generated between preceding pulses of the synchronization signal; and
   a pulse filter:
   applying said number of clock pulses stored in said pulse number memory and a given nominal number of clock pulses to ascertain a number of pulses needing to be filtered out of said generated clock signal; and
   filtering said generated clock signal to allow a number of clock pulses corresponding to said nominal clock frequency to be tapped off as said stabilized clock signal.

2. The clock generator unit according to claim 1, wherein said pulse number memory stores a number of clock pulses generated between two preceding pulses of the synchronization signal.

3. The clock generator unit according to claim 1, wherein said pulse number memory stores an average number of clock pulses generated between a plurality of preceding pulses of the synchronization signal.

4. The clock generator unit according to claim 1, including a synchronization decoder receiving an input signal, said synchronization decoder being connected to said stabilized clock signal and ascertaining the synchronization signal from the input signal.

5. The clock generator unit according to claim 1, wherein the synchronization signal is a synchronization signal provided in accordance with USB specifications.

6. The clock generator unit according to claim 1, wherein
   said pulse filter has an output supplying said stabilized clock signal at a stabilized clock frequency;
   a frequency divider is connected to said pulse filter and generates an operating clock signal by division from said stabilized clock signal; and
   said stabilized clock frequency is higher, in an even-numbered ratio, than a required nominal frequency of said operating clock signal.

7. The clock generator unit according to claim 1, wherein
   said pulse filter has an output supplying said stabilized clock signal at a stabilized clock frequency;
   a frequency divider is connected to said pulse filter and generates an operating clock signal by division from said stabilized clock signal, said operating clock signal having a required nominal frequency; and
   said stabilized clock frequency is higher, in an even-numbered ratio, than said required nominal frequency.

8. A clock generator unit for receiving a synchronization signal, comprising:
   an internal clock generator generating clock pulses as a generated clock signal at an internal clock frequency greater than or equal to a nominal clock frequency of a desired stabilized clock signal;
   a pulse counter connected to said internal clock generator, said pulse counter to be set to a start value by the synchronization signal;
   a pulse number memory connected to said pulse counter, said pulse number memory storing, as an actual value, a number of clock pulses generated between preceding pulses of the synchronization signal; and
   a pulse filter connected to said internal clock generator and to said pulse number memory, said pulse filter:
   applying said number of clock pulses stored in said pulse number memory and a given nominal number of clock pulses to ascertain a number of pulses needing to be filtered out of said generated clock signal; and
   filtering said generated clock signal to allow a number of clock pulses corresponding to said nominal clock frequency to be tapped off as said stabilized clock signal.

9. The clock generator unit according to claim 8, wherein said pulse number memory stores a number of clock pulses generated between two preceding pulses of the synchronization signal.

10. The clock generator unit according to claim 8, wherein said pulse number memory stores an average number of clock pulses generated between a plurality of preceding pulses of the synchronization signal.

11. The clock generator unit according to claim 8, including a synchronization decoder receiving an input signal, said synchronization decoder being connected to said stabilized clock signal and ascertaining the synchronization signal from the input signal.

12. The clock generator unit according to claim 8, wherein the synchronization signal is a synchronization signal provided in accordance with USB specifications.

13. The clock generator unit according to claim 8, wherein
    said pulse filter has an output supplying said stabilized clock signal at a stabilized clock frequency;
    a frequency divider is connected to said pulse filter and generates an operating clock signal by division from said stabilized clock signal; and
    said stabilized clock frequency is higher, in an even-numbered ratio, than a required nominal frequency of said operating clock signal.

14. The clock generator unit according to claim 8, wherein
    said pulse filter has an output supplying said stabilized clock signal at a stabilized clock frequency;
    a frequency divider is connected to said pulse filter and generates an operating clock signal by division from said stabilized clock signal, said operating clock signal having a required nominal frequency; and
    said stabilized clock frequency is higher, in an even-numbered ratio, than said required nominal frequency.

15. A clock generator unit for receiving a synchronization signal, comprising:
    an internal clock generator generating clock pulses as a generated clock signal at an internal clock frequency greater than or equal to a nominal clock frequency of a desired stabilized clock signal;
    a pulse counter connected to said internal clock generator, said pulse counter to be set to a start value by the synchronization signal;
    a pulse number memory connected to said pulse counter, said pulse number memory storing, as an actual value, a number of clock pulses generated between preceding pulses of the synchronization signal; and
    a pulse filter connected to said internal clock generator and to said pulse number memory, said pulse filter:
        ascertaining a number of pulses needing to be filtered out of said generated clock signal based upon said number of clock pulses stored in said pulse number memory and a given nominal number of clock pulses; and
        filtering said generated clock signal to allow a number of clock pulses corresponding to said nominal clock frequency to be tapped off as said stabilized clock signal.

16. The clock generator unit according to claim 15, wherein said pulse number memory stores a number of clock pulses generated between two preceding pulses of the synchronization signal.

17. The clock generator unit according to claim 15, wherein said pulse number memory stores an average number of clock pulses generated between a plurality of preceding pulses of the synchronization signal.

18. The clock generator unit according to claim 15, including a synchronization decoder receiving an input signal, said synchronization decoder being connected to said stabilized clock signal and ascertaining the synchronization signal from the input signal.

19. The clock generator unit according to claim 15, wherein the synchronization signal is a synchronization signal provided in accordance with USB specifications.

20. The clock generator unit according to claim 15, wherein
    said pulse filter has an output supplying said stabilized clock signal at a stabilized clock frequency;
    a frequency divider is connected to said pulse filter and generates an operating clock signal by division from said stabilized clock signal; and
    said stabilized clock frequency is higher, in an even-numbered ratio, than a required nominal frequency of said operating clock signal.

21. The clock generator unit according to claim 15, wherein
    said pulse filter has an output supplying said stabilized clock signal at a stabilized clock frequency;
    a frequency divider is connected to said pulse filter and generates an operating clock signal by division from said stabilized clock signal, said operating clock signal having a required nominal frequency; and
    said stabilized clock frequency is higher, in an even-numbered ratio, than said required nominal frequency.

* * * * *